(12) United States Patent
Hossain et al.

(10) Patent No.: US 11,031,341 B2
(45) Date of Patent: Jun. 8, 2021

(54) SIDE MOUNTED INTERCONNECT BRIDGES

(71) Applicants: Intel Corporation, Santa Clara, CA (US); Md Altai Hossain, Portland, OR (US); Kevin J Doran, North Plains, OR (US); Yu Amos Zhang, Raleigh, NC (US); Zhiguo Qian, Chandler, AZ (US)

(72) Inventors: Md Altai Hossain, Portland, OR (US); Kevin J Doran, North Plains, OR (US); Yu Amos Zhang, Raleigh, NC (US); Zhiguo Qian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/474,005

(22) PCT Filed: Mar. 29, 2017

(86) PCT No.: PCT/US2017/024803
§ 371 (c)(1),
(2) Date: Jun. 26, 2019

(87) PCT Pub. No.: WO2018/182598
PCT Pub. Date: Oct. 4, 2018

(65) Prior Publication Data
US 2019/0341349 A1  Nov. 7, 2019

(51) Int. Cl.
*H01L 23/538* (2006.01)
*H01L 25/18* (2006.01)
(Continued)

(52) U.S. Cl.
CPC .......... *H01L 23/5381* (2013.01); *H01L 23/13* (2013.01); *H01L 23/49805* (2013.01);
(Continued)

(58) Field of Classification Search
CPC .................. H01L 23/5381; H01L 23/49805
See application file for complete search history.

(56) References Cited

U.S. PATENT DOCUMENTS 6,861,287 B2   3/2005  Farrar et al.
9,418,966 B1 *  8/2016  Kwon ................ H01L 25/072
(Continued)

FOREIGN PATENT DOCUMENTS

WO   WO-2016160283 A1   10/2016
WO   WO-2018182598 A1   10/2018

OTHER PUBLICATIONS

"International Application Serial No. PCT/US2017/024803, International Search Report dated Nov. 24, 2017", 3 pgs.
(Continued)

*Primary Examiner* — Kevin Parendo
(74) *Attorney, Agent, or Firm* — Schwegman Lundberg & Woessner, P.A.

(57) ABSTRACT

A device and method of utilizing an interconnect bridge to electrically couple two semiconductor dies located on different surfaces. Integrated circuit packages using an interconnect bridge to electrically couple a semiconductor die on a substrate to a semiconductor die on a motherboard are shown. Integrated circuit packages using an interconnect bridge to electrically couple a semiconductor die on a top surface of a substrate to a semiconductor die on a bottom surface of a substrate are shown. Methods of electrically coupling semiconductor dies on different surfaces using interconnect bridges are shown.

7 Claims, 9 Drawing Sheets

(51) Int. Cl.
 H01L 23/498 (2006.01)
 H01L 23/13 (2006.01)
 H01L 25/065 (2006.01)

(52) U.S. Cl.
 CPC ...... *H01L 23/5383* (2013.01); *H01L 23/5386* (2013.01); *H01L 25/0652* (2013.01); *H01L 25/18* (2013.01); *H01L 2224/16225* (2013.01); *H01L 2225/06517* (2013.01); *H01L 2225/06572* (2013.01)

(56) References Cited

U.S. PATENT DOCUMENTS

| | | | |
|---|---|---|---|
| 2004/0084781 A1 | 5/2004 | Ahn et al. | |
| 2004/0207058 A1* | 10/2004 | Sohn | H01L 23/24 257/678 |
| 2005/0051906 A1* | 3/2005 | He | H01L 23/49805 257/779 |
| 2007/0228544 A1* | 10/2007 | Jung | H01L 25/105 257/686 |
| 2009/0230528 A1* | 9/2009 | McElrea | H01L 24/24 257/676 |
| 2010/0233852 A1* | 9/2010 | Do | H01L 21/6835 438/109 |
| 2010/0327424 A1 | 12/2010 | Braunisch et al. | |
| 2012/0061856 A1* | 3/2012 | Vora | H01L 23/5386 257/782 |
| 2012/0326293 A1* | 12/2012 | Kobayashi | H01L 23/49827 257/690 |
| 2013/0075915 A1 | 3/2013 | Kim et al. | |
| 2014/0175636 A1* | 6/2014 | Roy | H01L 23/5381 257/737 |
| 2018/0033743 A1* | 2/2018 | Saito | H01L 25/0655 |
| 2018/0076171 A1* | 3/2018 | Singh | H01L 23/5381 |
| 2018/0358296 A1* | 12/2018 | Li | H01L 23/5381 |
| 2019/0341349 A1* | 11/2019 | Hossain | H01L 25/0652 |

OTHER PUBLICATIONS

"International Application Serial No. PCT/US2017/024803, Written Opinion dated Nov. 24, 2017", 5 pgs.
"International Application Serial No. PCT US2017 024803, International Preliminary Report on Patentability dated Oct. 10, 2019", 7 pgs.

* cited by examiner

SIDE MOUNTED INTERCONNECT BRIDGES

CLAIM OF PRIORITY

This application is a U.S. National Stage Application under 35 U.S.C. 371 from International Application No. PCT/US2017/024803, filed Mar. 29, 2017, published as WO 2018/182598, which is incorporated herein by reference in its entirety.

TECHNICAL FIELD

Embodiments described herein generally relate to die interconnect bridges for microelectronic devices.

BACKGROUND

Microelectronic devices such as integrated circuit packages often use a substrate to attach silicon dies to a larger circuit board, often called a motherboard. The substrate helps to support and protect the silicon dies, provide heat dissipation, and signal and power distribution. When multiple silicon dies are attached to a single surface of a substrate, an interconnect bridge can be utilized to electrically couple the silicon dies.

DESCRIPTION OF EMBODIMENTS

Figure 1:
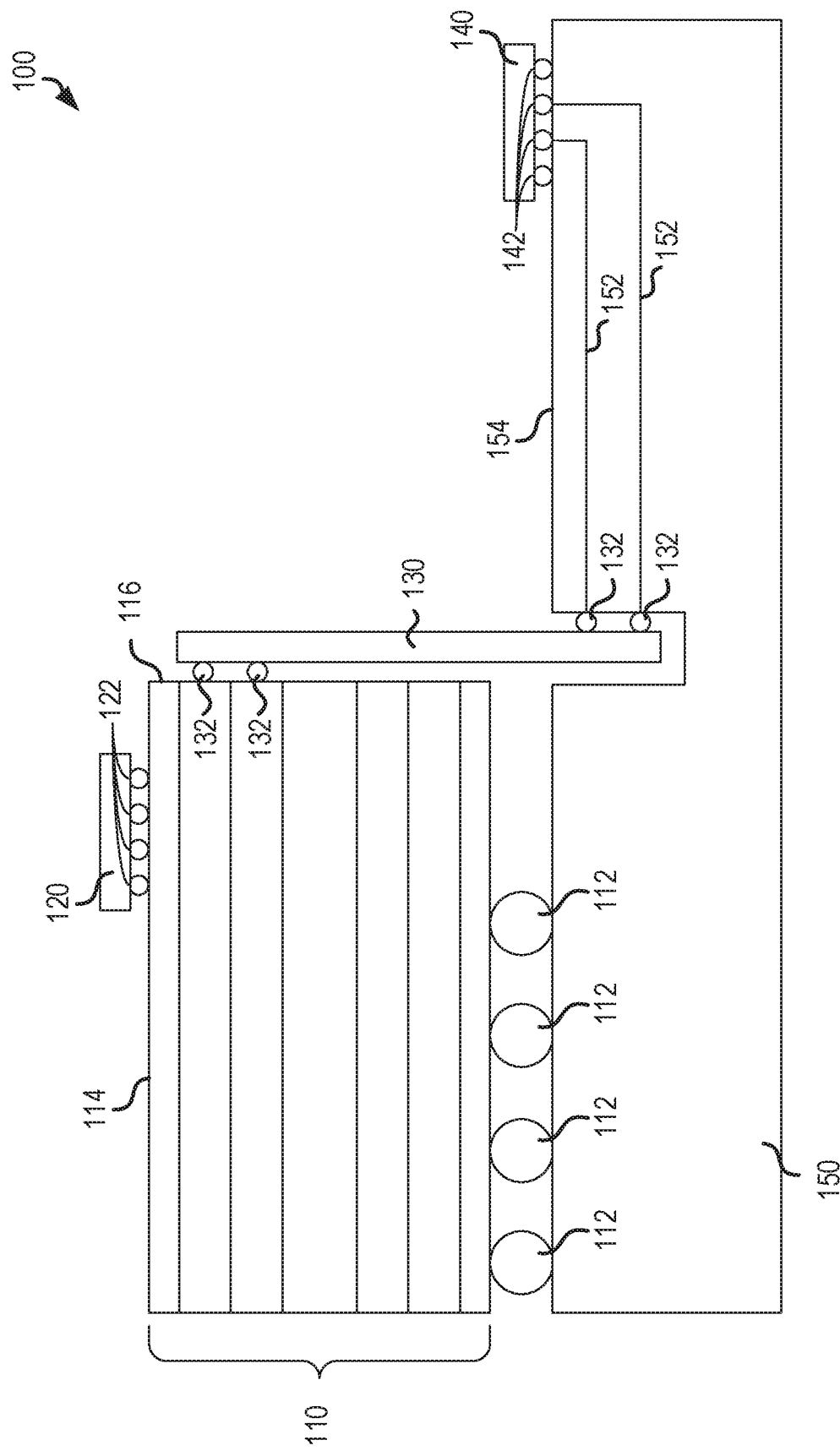
FIG. 1 is a cross-sectional view of an apparatus including an integrated circuit package utilizing an interconnect bridge such that a first end of the interconnect bridge is mounted to a side surface of a substrate and a second end of the interconnect bridge is attached to a motherboard.

FIG. 1 shows one example of a cross-sectional view of an apparatus 100 including an integrated circuit package utilizing an interconnect bridge 130 with a first end attached to a side surface of a substrate 110 and a second end attached to a motherboard 150 to electrically couple a first semiconductor die 120 and a second semiconductor die 140. In some examples, the interconnect bridge 130 is passive. The passive interconnect bridge can be made of materials that include silicon, glass, polymer, or ceramic. In some examples, the interconnect bridge 130 includes a repeater circuit.

The first end of the interconnect bridge 130 is attached to the substrate 110 and the second end of the interconnect bridge 130 is attached to the motherboard 150 using side interconnects 132. The first semiconductor die 120 is attached to a top surface 114 of the substrate 110 using a first set of semiconductor interconnects 122. Examples of semiconductor die include a memory, a wireless device, a sensor, a graphics processing unit, a central processing unit, or other integrated circuit. The first semiconductor die 120 is electrically coupled to the first end of the interconnect bridge 130 through the first set of semiconductor interconnects 122 which are connected to a set of substrate traces in the substrate 110. In an example, the set of semiconductor die interconnects 122 is an array of micro-humps.

The set of substrate traces connect the first set of semiconductor interconnects to the side interconnects 132 that connect the interconnect bridge 130 to the substrate 110. The substrate 110 electrically couples the first semiconductor die 120 to the interconnect bridge 130. In an example, the side interconnects 132 are a set of multi-layer break out pads. The multi-layer break out pads can be made of materials that include copper, gold, aluminum, or other conductive material. The second semiconductor die 140 is attached to a top surface 154 of the motherboard 150 using a set second set of semiconductor interconnects 142. The set of semiconductor interconnects can be C4 bumps, an array of micro-bumps, or other package interconnects. The motherboard 150 may be a circuit board, a printed circuit board, interposer, or other board designed for multiple components. The second semiconductor is electrically coupled to the second end of the interconnect bridge 130 through the second set of semiconductor interconnects 142 and a set of motherboard traces 152. The substrate 110 is attached to the motherboard 150 using substrate interconnects 112. The substrate interconnects 112 can be solder balls, wire bonds, conductive epoxy, etc. In some examples the substrate interconnects 112 are a ball grid array.

Attaching the interconnect bridge 130 on a side surface 114 of the substrate 110 allows for high density interconnects between semiconductor dies without requiring the semiconductor dies to be located on a single surface of the substrate 110. As shown in the example cross-sectional view of the integrated circuit 100, a first semiconductor die 120 can be attached to a top surface 114 of the substrate 110 and the second semiconductor die 140 can be attached to the motherboard 150. This allows the substrate 110 to be smaller than conventional solutions because extra surface area is not required for the second semiconductor die 140. This may be achieved by attaching the interconnect bridge 130 on a side surface 114 of the substrate 110. In some examples, the interconnect bridge 130 is in a substantially vertical orientation. Attaching the interconnect bridge 130 to a side surface 114 of the substrate 110 and/or in a substantially vertical orientation retains the benefits of using an interconnect bridge to electrically couple semiconductor dies without the need for the semiconductor dies to be attached to the same surface, or reside in the same plane. These benefits include a reduction of crosstalk, a reduction of insertion loss, a reduction in return loss, general improvements in signal integrity, significant improvements to electrical performance, and a reduction in the size of the substrate 110. Reduction in the size of the substrate 110 is achieved by not needing both semiconductor dies to be attached to the same surface or for the semiconductor dies and the interconnect bridge 130 to lie in the same plane.

To attach the interconnect bridge 130 to a side surface 114 of the substrate 110, side interconnects 132 are used. In some examples, traces within the substrate extend to the side surface 114 of the substrate 110 ending in multi-layer break out pads. These traces can run through multiple layers of the substrate, allowing the multi-layer break out pads to connect with the interconnect bridge 130 from multiple layers of the substrate. Side interconnects 132 are also used at the motherboard 150 to attach to the interconnect bridge 130. As shown, the interconnect bridge 130 attaches within a cavity of the motherboard 150. In some examples, the motherboard 150 does not have a cavity and the interconnect bridge 130 is attached to a side surface of the motherboard 150.

Figure 2:
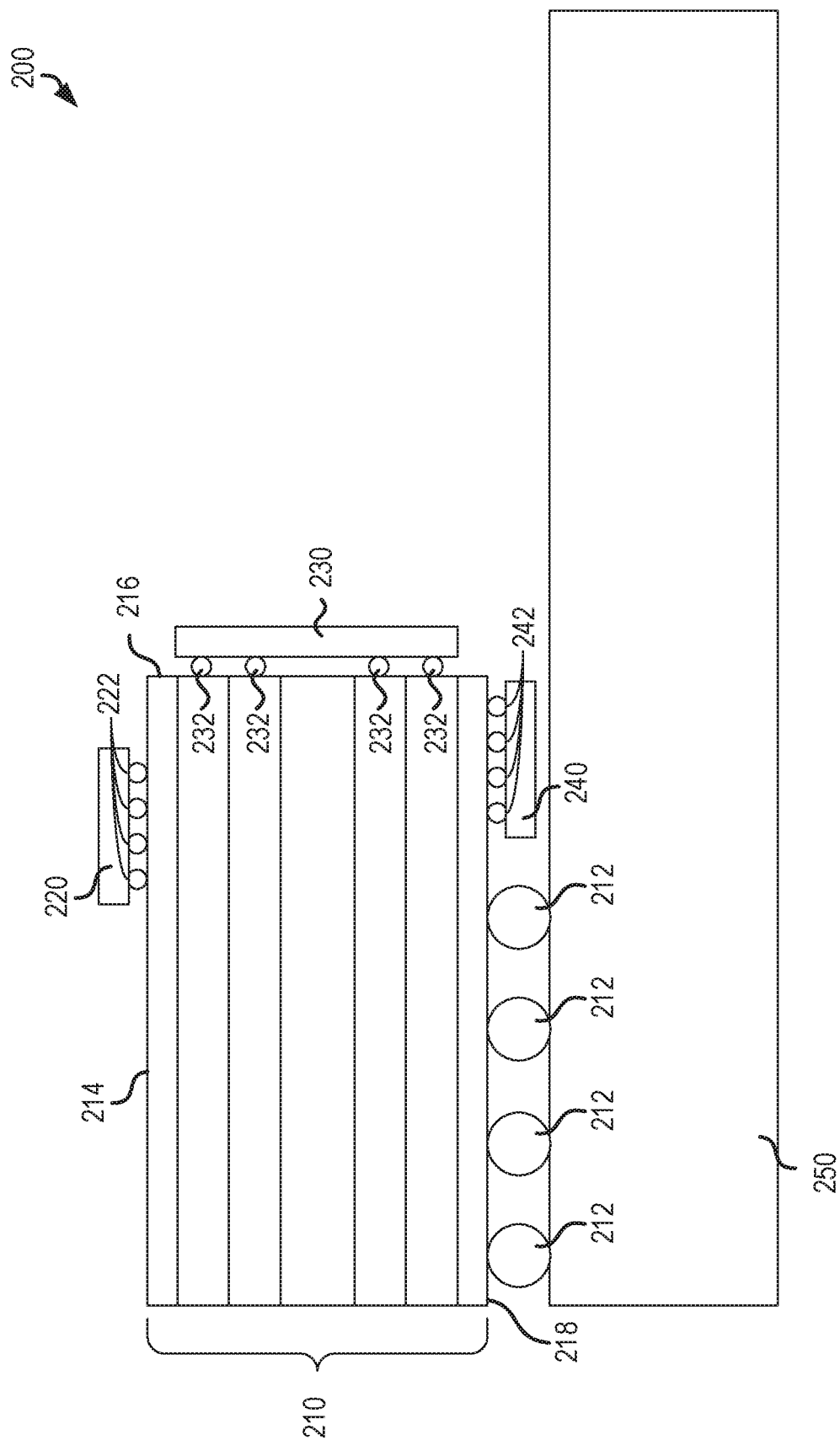
FIG. 2 is a cross-sectional view of apparatus including an integrated circuit package utilizing an interconnect bridge mounted to a side surface of a substrate to electrically couple two semiconductor dies.

FIG. 2 shows one example of a cross-sectional view of an integrated circuit package 200 utilizing an interconnect bridge 230 mounted to a side surface of a substrate 210 to electrically couple a first semiconductor die 220 and a second semiconductor die 240. In some examples, the interconnect bridge 230 is passive. The passive interconnect bridge can be made of materials that include silicon, glass, polymer, or ceramic. In some examples, the interconnect bridge 230 includes a repeater circuit.

As shown the interconnect bridge is attached to the substrate 210 using side interconnects 232. The first semiconductor die 220 is attached to a top surface 214 of the substrate 210 using semiconductor interconnects 222. Examples of semiconductor die include a memory, a wireless device, a sensor, a graphics processing unit, a central processing unit, or other integrated circuit. The first semiconductor die 220 is electrically coupled to the first end of the interconnect bridge 230 through the semiconductor interconnects 222 that are connected to a first set of substrate traces which are connected to the set of side interconnects 232 at the first end of the interconnect bridge 230. In an example, the set of semiconductor die interconnects 222 is an array of micro-bumps.

The second semiconductor die 240 is attached to a bottom surface 218 of the substrate 210 using a second set of semiconductor interconnects 242. The second set of semiconductor interconnects 242 are connected to a second set of substrate traces which are connected to the side interconnects 232 at the second end of the interconnect bridge 230. In an example, the side interconnects 232 are a set of multi-layer break out pads. The multi-layer break out pads can be made of materials that include copper, gold, aluminum, or other conductive material. The substrate 210 is attached to the motherboard 250 using substrate interconnects 212. The motherboard 250 may be a circuit board, a printed circuit board, interposer, or other board designed for multiple components. The substrate interconnects 212 can be solder balls, wire bonds, conductive epoxy, etc. In some examples, the substrate interconnects 212 are a ball grid array. In some examples, the substrate interconnects 212, the side interconnects 232, and the semiconductor interconnects 242 are all the same type of interconnect. In some examples, the substrate interconnects 212, the side interconnects 232, and the semiconductor interconnects 242 are each a different type of interconnect. In some examples, two of either the substrate interconnects 212, the side interconnects 232, and the semiconductor interconnects 242 are the same type of interconnect and the third is a different type of interconnect.

Attaching the interconnect bridge 230 to a side surface 216 of the substrate 210 allows for high density interconnects between semiconductor dies without requiring the semiconductor dies to be located on a single surface of the substrate 210. As shown in the example cross-sectional view of the integrated circuit 200, a first semiconductor die 220 can be attached to a top surface 214 of the substrate 210 and the second semiconductor die 240 can be attached to a bottom surface 218 of the substrate 210. This allows the substrate 210 to be smaller than conventional solutions, while having both semiconductors on the substrate 210 because the surface area for the second semiconductor die 240 is not required to be on the same surface that the first semiconductor die 220 is attached to. This is achieved by attaching the interconnect bridge 230 on a side surface 216 of the substrate 210. In some examples, the interconnect bridge 230 is in a substantially vertical orientation. Attaching the interconnect, bridge 230 to a side surface 216 of the substrate 210 and/or in a substantially vertical orientation retains the benefits of using an interconnect bridge to electrically couple semiconductor dies without the need for the semiconductor dies to be attached to the same surface, or reside in the same plane. The benefits of using the interconnect bridge 230 in this manner include a reduction of crosstalk, a reduction of insertion loss, a reduction in return loss, general improvements to signal integrity, and a reduction in the size of the substrate 210.

To attach the interconnect bridge 230 to a side surface 216 of the substrate 210, side interconnects 232 are used. In some examples, traces within the substrate extend to the side surface 216 of the substrate 210 ending in multi-layer break out pads. These traces can run through multiple layers of the substrate, allowing the multi-layer break out pads to connect with the interconnect bridge 230 at multiple layers of the substrate.

Figure 3:
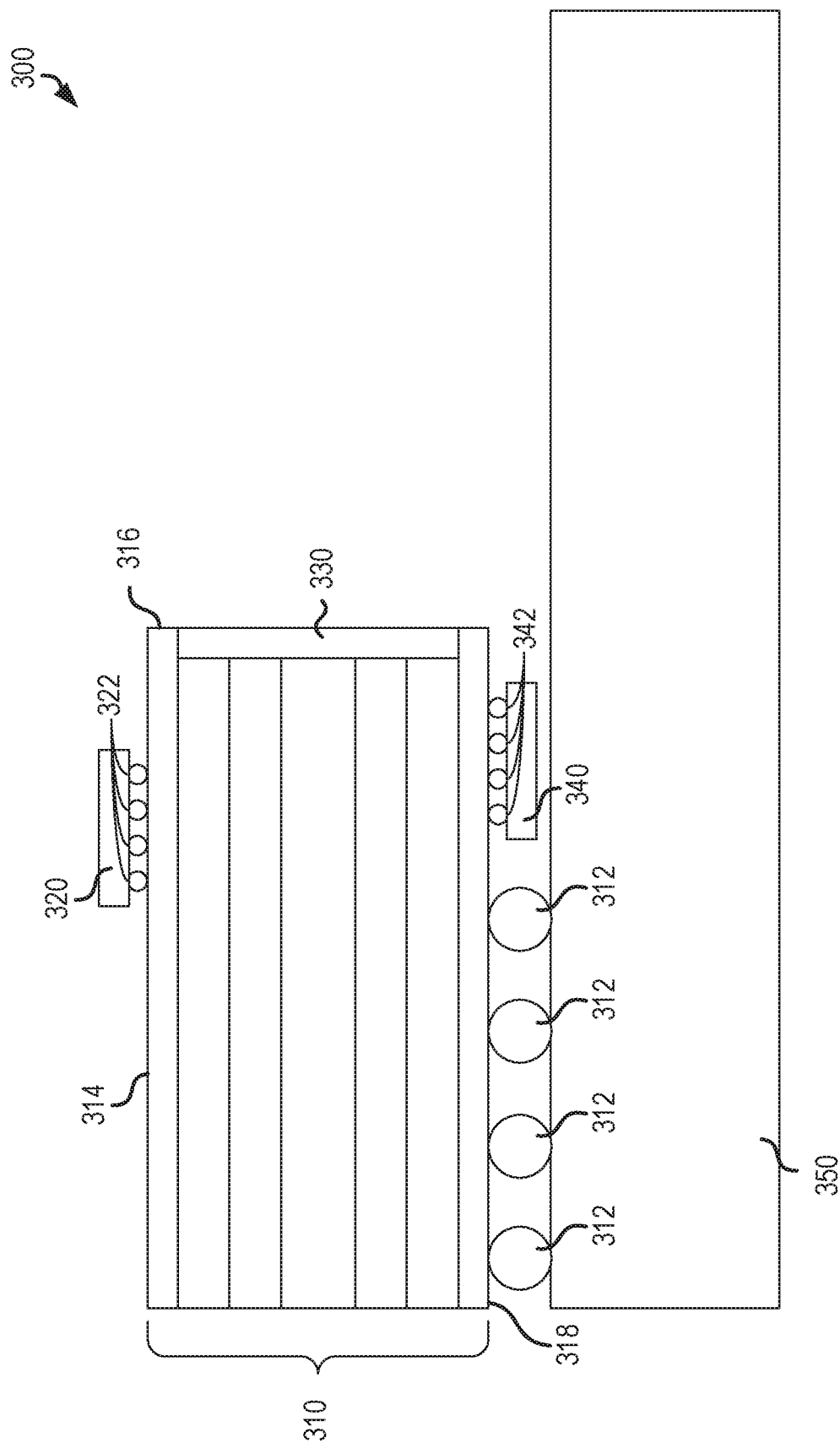
FIG. 3 is a cross-sectional view of an apparatus including an integrated circuit package utilizing an interconnect bridge embedded in a side surface of a substrate to electrically couple three semiconductor dies.

FIG. 3 shows one example of a cross-sectional view of an integrated circuit package 300 utilizing an interconnect bridge 330 embedded in a side surface of a substrate 310. In some examples, the interconnect bridge 330 is passive. The passive interconnect bridge can be made of materials that include silicon, glass, polymer, or ceramic. In some examples, the interconnect bridge 330 includes a repeater circuit.

The first semiconductor die 320 is attached to a top surface 314 of the substrate 310 using a first set of semiconductor interconnects 322. Examples of semiconductor die include a memory, a wireless device, a sensor, a graphics processing unit, a central processing unit, or other integrated circuit. The first set semiconductor interconnects 322 are connected to a first set of substrate traces which are connected to a first end of the interconnect bridge 330 using a set of side interconnects. In an example, the set of semiconductor die interconnects 322 is an array of micro-bumps.

The second semiconductor die 340 is attached to a bottom surface 318 of the substrate 310 using a second set of semiconductor interconnects 342. The second set of semiconductor interconnects 342 are connected to a second set of substrate traces which are connected to the second end of the interconnect bridge 330 using a set of side interconnects. In an example, the side interconnects 332 are a set of multi-layer break out pads. The multi-layer break out pads can be made of materials that include copper, gold, aluminum, or other conductive material. The substrate 310 is attached to a motherboard 350 using a set of substrate interconnects 312. The motherboard 350 may be a circuit hoard, a printed circuit board, interposer, or other board designed for multiple components. The substrate interconnects 312 can be solder balls, wire bonds, conductive epoxy, etc. In some examples the substrate interconnects 312 are a ball-grid array.

Embedding the interconnect bridge 330 in a side surface 316 of the substrate 310 allows for a high density connection between semiconductor dies without requiring the semiconductor dies to be located on a single surface of the substrate 310. As shown in the example cross-sectional view of the integrated circuit 300, a first semiconductor die 320 can be attached to a top surface 314 of the substrate 310 and the second semiconductor die 240 can be attached to a bottom surface 318 of the substrate 310. This allows the substrate 310 to be smaller, while having both semiconductors on the substrate 310 because the surface area for the second semiconductor die 340 is not required to be on the same surface that the first semiconductor die 320 is attached to. This is achieved by embedding the interconnect bridge 330 in a side surface 316 of the substrate 310. In some examples, the interconnect bridge 330 is in a substantially vertical orientation. Embedding the interconnect bridge 330 in a side surface 316 of the substrate 310 and/or in a substantially vertical orientation retains the benefits of using an interconnect bridge to electrically couple semiconductor dies without the need for the semiconductor dies to be attached to the same surface, or reside in the same plane. In some examples, the interconnect bridge 330 is embedded in the substrate 310 away from any side surface. The benefits of using the interconnect bridge 330 include a reduction of crosstalk, a reduction of insertion loss, a reduction in return loss, and general improvements to signal integrity.

Figure 4:
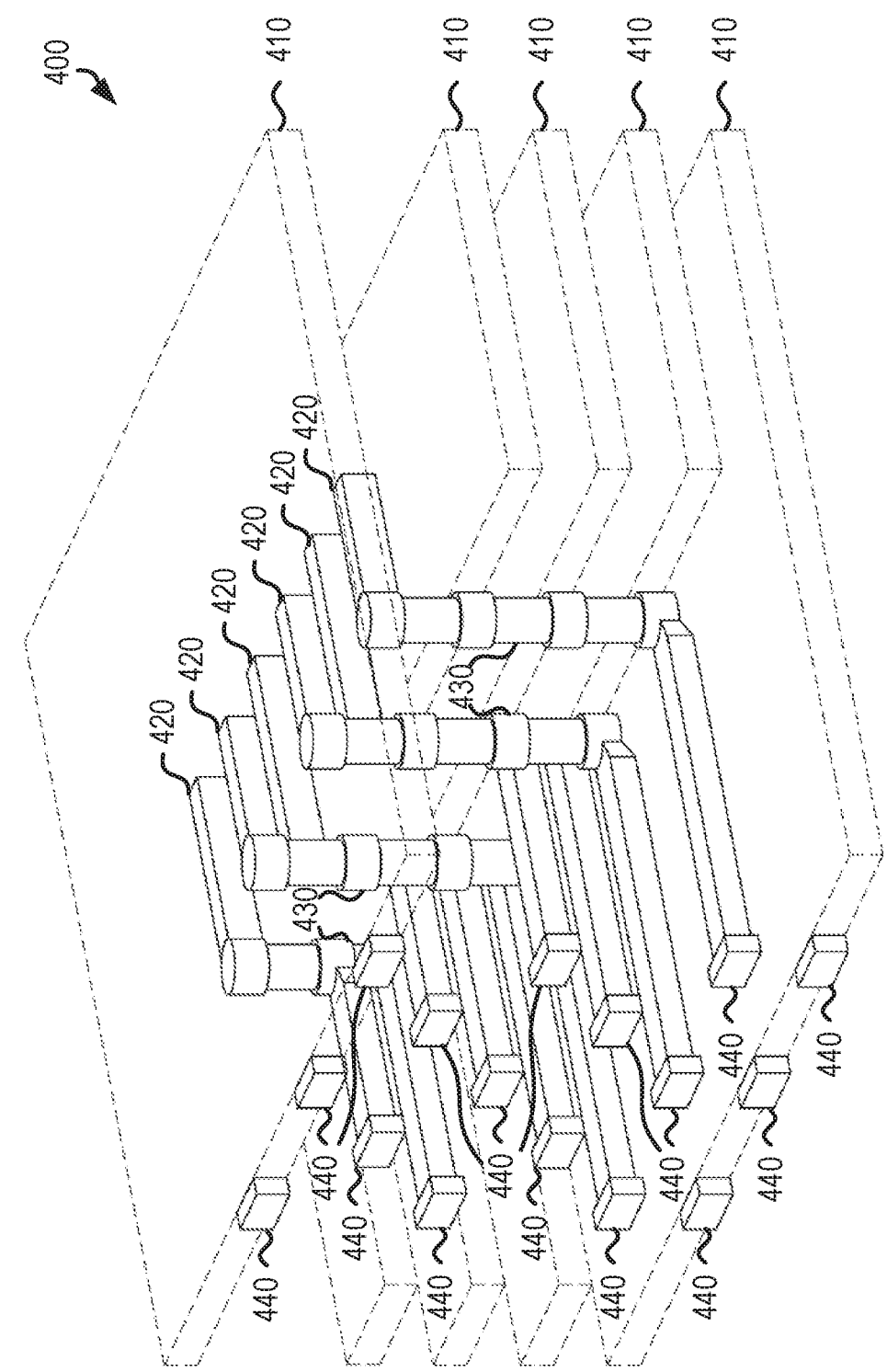
FIG. 4 is an isometric view of a portion of a substrate s trace routing for multi-layer break out pads.

FIG. 4 shows an isometric view of an example portion of a substrate 400 utilizing a set of multi-layer break out pads 440 on a side surface of a substrate. In some examples, the substrate 400 may be representative of the substrates in FIGS. 1, 2, and 3. The substrate 400 is composed of multiple layers 410. A set of traces 420 is shown in a single layer break in routing configuration. In some examples the single layer break in routing configuration is used to distribute signals, power connections, and ground connections from a semiconductor die within a single layer 410 of the substrate.

Vertical interconnects 430 are used to distribute the set of traces 420 from the single layer break in routing to other layers 410 of the substrate 400. In some examples, the vertical interconnects 430 are through-silicon vias. The set of traces 420 extend out from the vertical interconnects 430 to various layers 410 of the substrate 400. Some traces of the set of traces 420 are shown extending out to a side surface of the substrate 400 terminating in multi-layer breakout pads 440. The multi-layer break out pads 440 can be used as electrical interconnects that allow for signal, power, and ground connections on a side surface of the substrate 400. In some examples, multi-layer break out pads 440 can be used to attach components, such as an interconnect bridge, to a side surface of the substrate without being used as an electrical interconnect for signals, power, or ground. The multi-layer break out pads 440 can be made of materials that include copper, gold, aluminum, or other conductive material.

Figure 5:
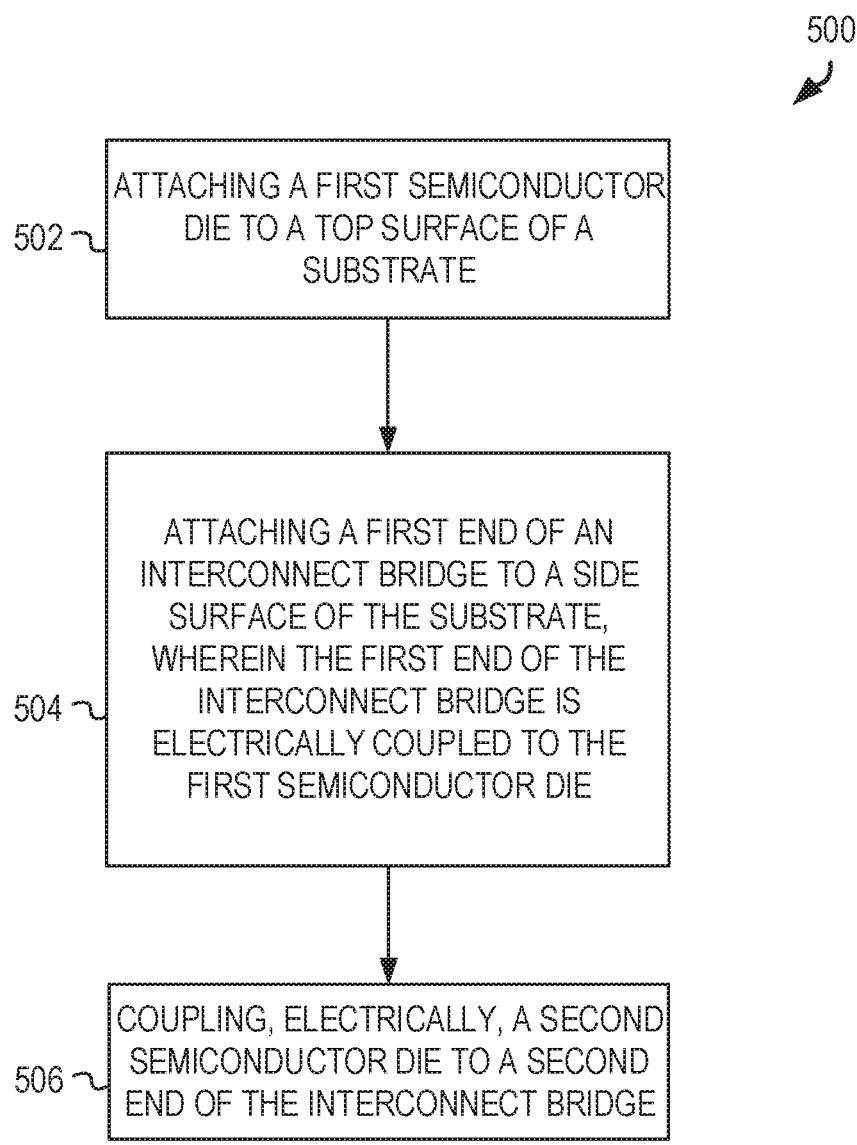
FIG. 5 is a process diagram of a method in accordance with some embodiments of the invention.

FIG. 5 shows steps in an example process 500 of electrically coupling semiconductor dies using an interconnect bridge attached to a side surface of a substrate. In FIG. 5 a first semiconductor die is attached to a top surface of a substrate 502. In some examples, the first semiconductor can be attached to the substrate using an array of micro-bumps. Micro-bumps can be comprised of materials including copper, gold, conductive epoxy, or other conductive material.

A first end of an interconnect bridge is attached to a side surface of the substrate, wherein the first end of the interconnect bridge is electrically coupled to the first semiconductor 504. In some examples, the interconnect bridge is attached to the substrate using a set of side interconnects. The side interconnects can include multi-layer break out pads, micro-bumps, or a ball grid array.

A second semiconductor die is electrically coupled to a second end of the interconnect bridge 506. In some examples the second semiconductor die is located on a motherboard. The motherboard may be a circuit board, a printed circuit board, interposer, or other board designed for multiple components. The second end of the interconnect bridge can be attached to a side surface of the motherboard such that the second end of the interconnect bridge is electrically coupled to the second semiconductor die. The interconnect bridge then electrically couples the first and second semiconductor die and provides a signal path between them. In some examples, the side surface of the motherboard is located within a cavity in the motherboard. In some examples, the second end of the interconnect bridge cart be attached to the motherboard using a set of side interconnects. The set of side interconnects can include multi-layer break out pads, micro-bumps, or a ball grid array.

In some examples, the second semiconductor die is located on a bottom surface of the substrate. The second end of the interconnect bridge can be attached to a side surface of the substrate such that the second end of the interconnect bridge is electrically coupled to the second semiconductor die. The interconnect bridge then electrically couples the first and second semiconductor die and provides a signal path between them. In some examples, the second end of the interconnect bridge can be attached to the substrate using a set of side interconnects. The set of side interconnects can include multi-layer break out pads, micro-bumps, or a ball grid array.

Figure 6:
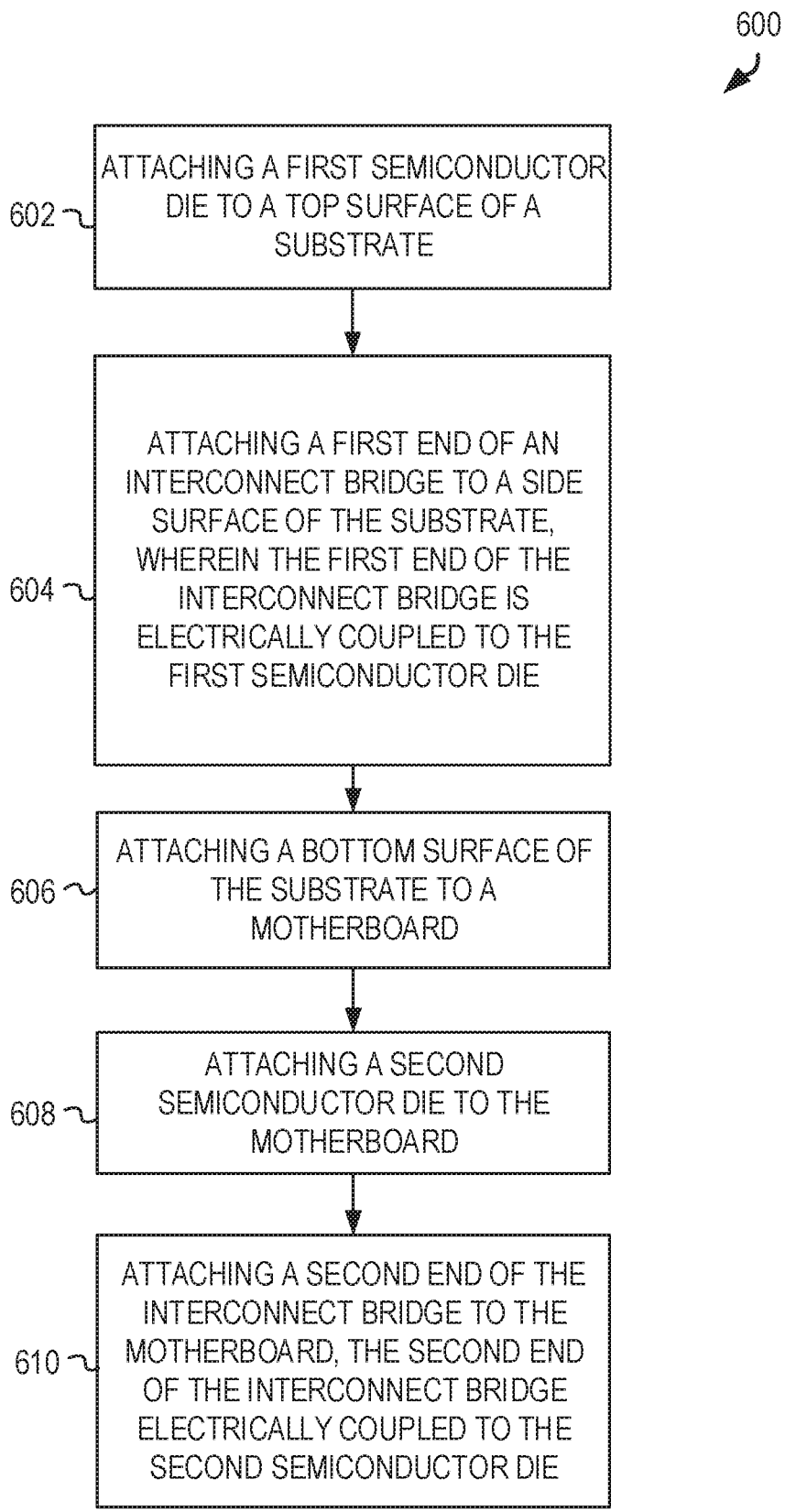
FIG. 6 is a process diagram of a method in accordance with some embodiments of the invention.

FIG. 6 shows steps in an example process 600 of electrically coupling semiconductor dies using an interconnect bridge attached to a side surface of a substrate. In FIG. 6 a first semiconductor die is attached to a top surface of a substrate 602. In some examples, the first semiconductor can be attached to the substrate using an array of micro-bumps. Micro-bumps can be comprised of materials including copper, gold, conductive epoxy, or other conductive material.

A first end of an interconnect bridge is attached to a side surface of the substrate, wherein the first end of the interconnect bridge is electrically coupled to the first semiconductor die 604. In some examples, the interconnect bridge is attached to the substrate using a set of side interconnects. The side interconnects can include multi-layer break out pads, micro-bumps, or a ball grid array.

A bottom surface of the substrate is attached to a motherboard 606. The motherboard may be a circuit board, a printed circuit board, interposer, or other board designed for multiple components. The bottom surface of the substrate can be attached to the motherboard using a set of substrate interconnects. The substrate interconnects can be solder halls, wire bonds, conductive epoxy, etc. In some examples the substrate interconnects are a ball grid array.

A second semiconductor die is attached to the motherboard 608. The second semiconductor die can be attached to the motherboard using an array of micro-bumps. A second end of the interconnect bridge is attached to the motherboard, the second end of the interconnect bridge electrically coupled to the second semiconductor die 610. The interconnect bridge electrically couples the first and second semiconductor die and provides a signal path between them. In some examples, the side surface of the motherboard is located within a cavity in the motherboard. In some examples, the second end of the interconnect bridge can be attached to the motherboard using a set of side interconnects. The set of side interconnects can include multi-layer break out pads, micro-bumps, or a ball grid array.

Figure 7:
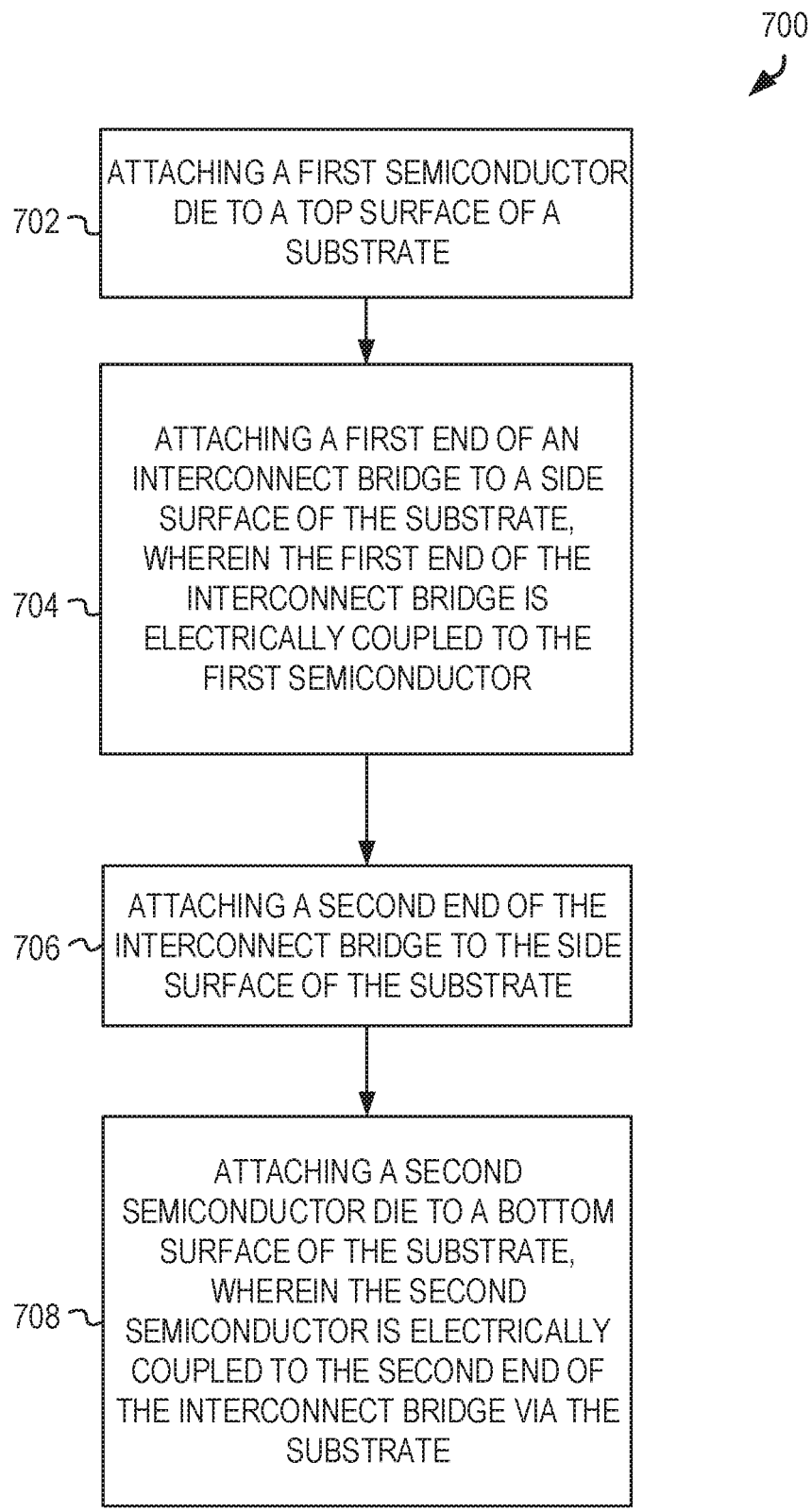
FIG. 7 is a process diagram of a method in accordance with some embodiments of the invention.

FIG. 7 shows steps in an example process 700 of electrically coupling semiconductor dies using an interconnect bridge attached to a side surface of a substrate. In FIG. 7 a first semiconductor die is attached to a top surface of a substrate 702. In some examples, the first semiconductor is attached to the top surface of the substrate using an array of micro-bumps. Micro-bumps can be comprised of materials including copper, gold, conductive epoxy, or other conductive material.

A first end of an interconnect bridge is attached to a side surface of the substrate, wherein the first end of the interconnect bridge is electrically coupled to the first semiconductor die 704. In some examples, the interconnect bridge is attached to the substrate using a set of side interconnects. The side interconnects can include multi-layer break out pads, micro-humps, or a ball grid array.

A second end of the interconnect bridge is attached to the side surface of the substrate 706. In some examples, the second end of the interconnect bridge can be attached to the substrate using a set of side interconnects. The set of side interconnects can include multi-layer break out pads, micro-bumps, or a ball grid array.

A second semiconductor die is attached to a bottom surface the substrate, wherein the second semiconductor die is electrically coupled to the second end of the interconnect bridge via the substrate 708. In some examples, the second semiconductor is attached to the substrate using an array of micro-bumps. The interconnect bridge electrically couples the first and second semiconductor die and provides a signal path between them.

Figure 8:
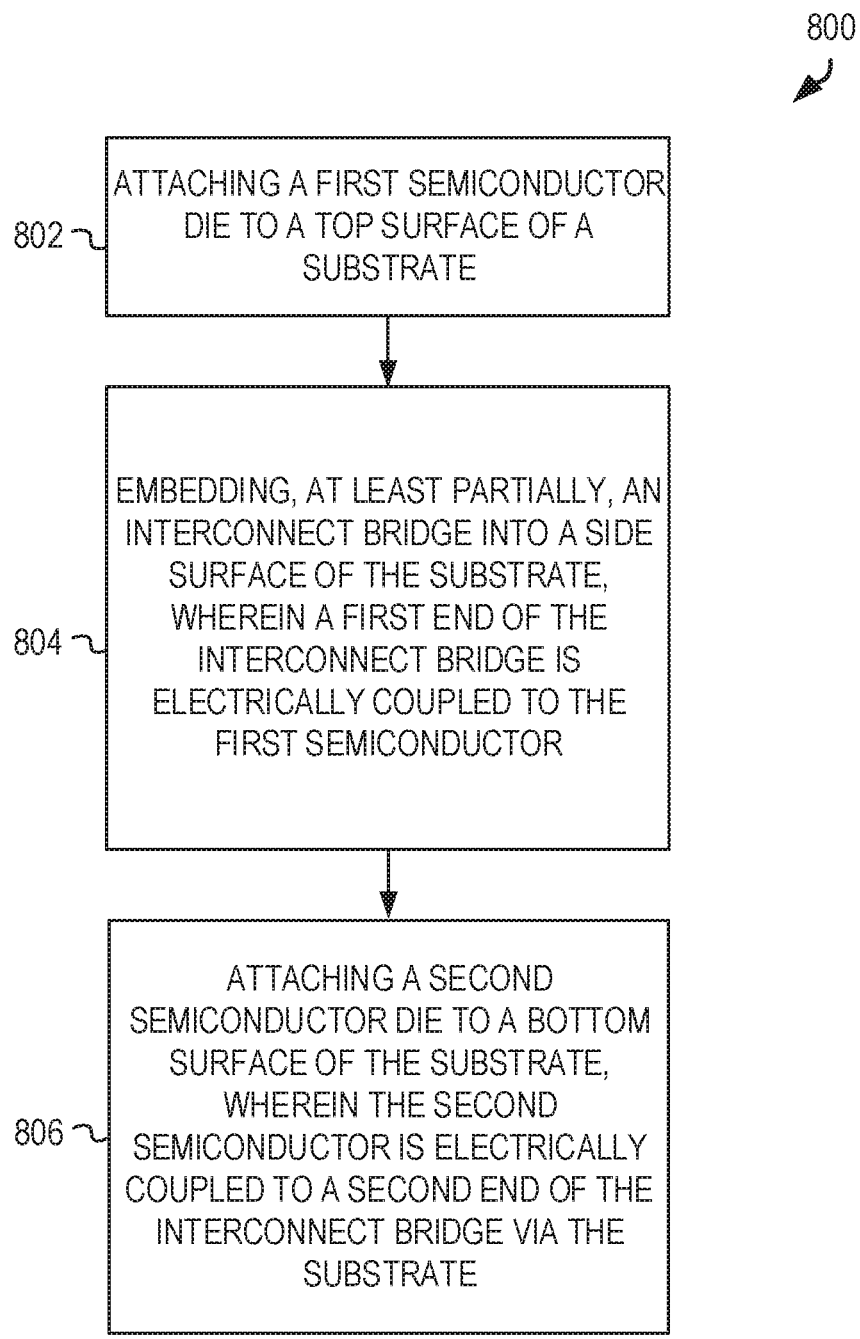
FIG. 8 is a process diagram of a method in accordance with some embodiments of the invention.

FIG. 8 shows steps in an example process 800 of electrically coupling semiconductor dies using an interconnect bridge at least partially embedded in a side surface of a substrate. In FIG. 8 a first semiconductor die is attached to a top surface of a substrate 802. In some examples, the first semiconductor is attached to the top surface of the substrate using an array of micro-bumps. Micro-bumps can be comprised of materials including copper, gold, conductive epoxy, or other conductive material.

An interconnect bridge is at least partially embedded in a side surface of the substrate, wherein a first end of the interconnect bridge is electrically coupled to the first semiconductor 804. In some examples, the interconnect bridge is electrically coupled to the substrate using a set of side interconnects. The side interconnects can include multi-layer break out pads, micro-bumps, or a ball grid array. The first end of the interconnect bridge can be electrically coupled to the first semiconductor, via the substrate, through a first set of side interconnects.

A second semiconductor die is attached to a bottom surface of the substrate, wherein the second semiconductor is electrically coupled to a second end of the interconnect bridge via the substrate 806. The interconnect bridge electrically couples the first and second semiconductor die and provides a signal path between them.

Figure 9:
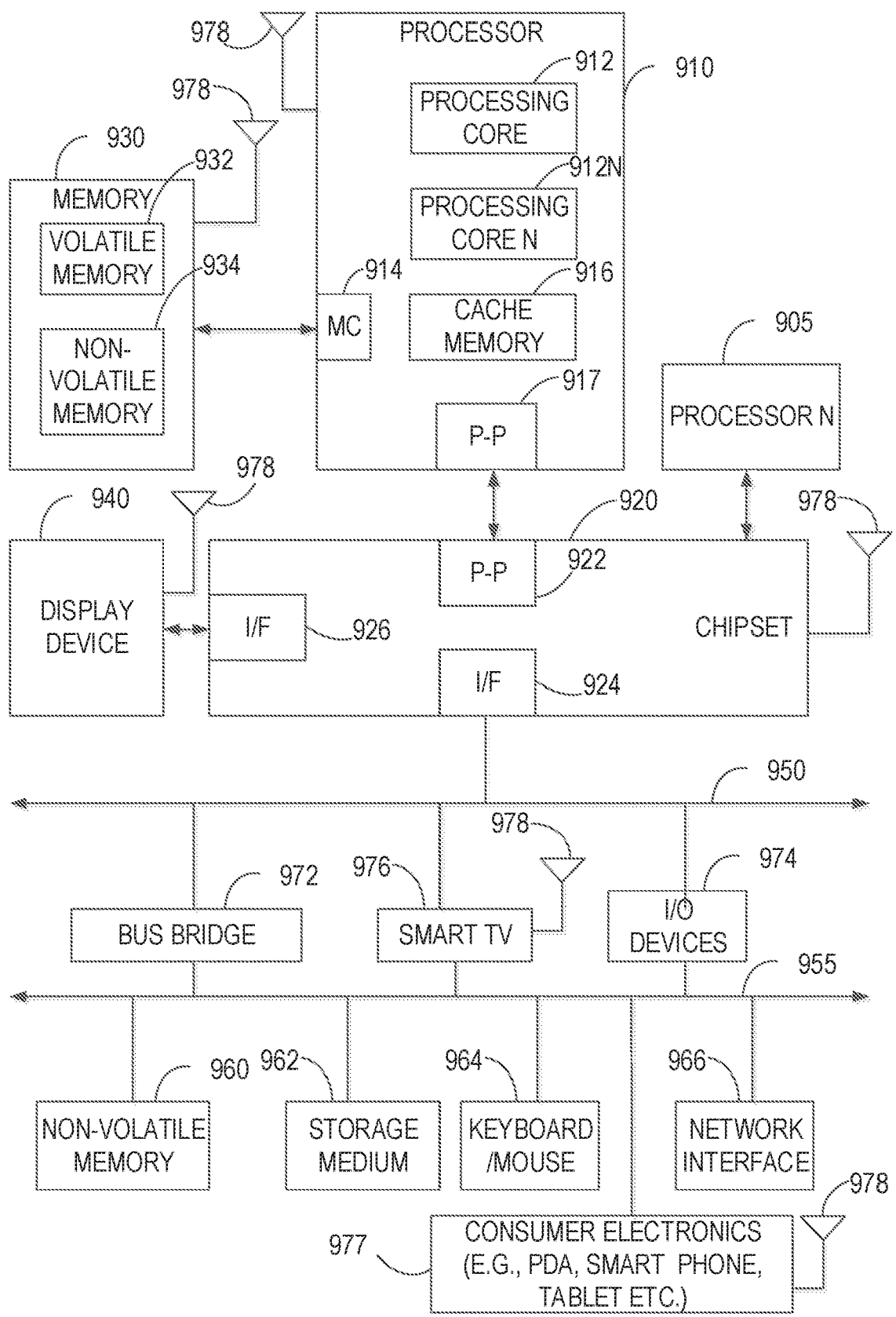
FIG. 9 is a block diagram of an electronic system in accordance with some embodiments of the invention.

FIG. 9 illustrates a system level diagram, according to one embodiment of the invention. For instance, FIG. 9 depicts an example of an electronic device (e.g., system) including the integrated circuit package utilizing an interconnect bridge attached to a side surface of a substrate described in the present disclosure. FIG. 9 is included to show an example of a higher level device application for the present invention. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processing cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, the wireless antenna interface 978 operates in accordance with, but is not limited to, the IEEE 902.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to electrically couple to other elements in system 900. In some embodiments of the invention, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices 972, 976, 974, 960, 962, 964, 966, 977, etc. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the invention, processor 910 and chipset 920 are merged into a single SOC. In addition, chipset 920 connects to one or more buses 950 and 955 that interconnect various elements 974, 960, 962, 964, and 966. Buses 950 and 955 may be interconnected together via a bus bridge 972. In one embodiment, chipset 920, via interface 924, couples with a non-volatile memory 960, a mass storage device(s) 962, a keyboard/mouse 964, a network interface 966, smart TV 976, consumer electronics 977, etc.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 902.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

To better illustrate the method and apparatuses disclosed herein, a non-limiting list of embodiments is provided here:

Example 1 is a semiconductor device, comprising: a substrate; a first semiconductor die attached to the substrate; an interconnect bridge attached to a side surface of the substrate and wherein the interconnect bridge is electrically coupled to the first semiconductor die; and a second semiconductor die electrically coupled to a second end of the interconnect bridge.

In Example 2, the subject matter of Example 1 optionally includes wherein the substrate includes multi-layer break out pads; and wherein the interconnect bridge is attached to the side surface of the substrate and electrically coupled to the semiconductor die via the multi-layer break out pads.

In Example 3, the subject matter of Example 2 optionally includes a motherboard attached to the substrate; and wherein the second semiconductor die is attached to the motherboard.

In Example 4, the subject matter of Example 3 optionally includes wherein the motherboard includes a cavity; wherein the second end of the interconnect bridge extends into the cavity of the motherboard; wherein the interconnect bridge is attached to the motherboard within the cavity of the motherboard; and wherein the interconnect bridge is electrically coupled to the second semiconductor die via the motherboard.

In Example 5, the subject matter of any one or more of Examples 2-4 optionally include wherein the second semiconductor die is attached to the substrate on a surface of the substrate opposite the first semiconductor die.

In Example 6, the subject matter of Example 5 optionally includes wherein the second end of the interconnect bridge is attached to the side surface of the substrate and electrically coupled to the second semiconductor die via the multi-layer break out pads.

In Example 7, the subject matter of any one or more of Examples 1-6 optionally include wherein the interconnect bridge is at least partially embedded in the side surface of the substrate.

In Example 8, the subject matter of Example 7 optionally includes wherein the second semiconductor die is attached to the substrate on a surface of the substrate opposite the surface of the substrate the first semiconductor die is attached to; and wherein the second semiconductor die is electrically coupled to the interconnect bridge.

In Example 9, the subject matter of any one or more of Examples 1-8 optionally include wherein the second semiconductor die is a memory die.

In Example 10, the subject matter of any one or more of Examples 1-9 optionally include wherein the first semiconductor die is a central processing unit.

In Example 11, the subject matter of any one or more of Examples 1-10 optionally include wherein the interconnect bridge is a silicon interconnect bridge.

In Example 12, the subject matter of any one or more of Examples 1-11 optionally include wherein the interconnect bridge is attached to the substrate substantially orthogonal to the first semiconductor die.

Example 13 is a semiconductor device, comprising: a substrate; a first semiconductor die attached to a top surface of the substrate; a silicon interconnect bridge attached to a side surface of the substrate, the side surface substantially orthogonal to the top surface, and wherein a first end of the silicon interconnect bridge is electrically coupled to the first semiconductor die via the substrate; and a second semiconductor die electrically coupled to a second end of the silicon interconnect bridge.

In Example 14, the subject matter of Example 13 optionally includes wherein the substrate includes multi-layer break out pads; and wherein the silicon interconnect bridge is attached to the side surface of the substrate and electrically coupled to the semiconductor die via the multi-layer break out pads.

In Example 15, the subject matter of Example 14 optionally includes a motherboard attached to a bottom surface of the substrate, the bottom surface opposite the top surface; and wherein the second semiconductor die is attached to the motherboard; wherein the motherboard includes a cavity; wherein the second end of the silicon interconnect bridge extends into the cavity of the motherboard; wherein the silicon interconnect bridge is attached to the motherboard within the cavity of the motherboard; and wherein the silicon interconnect bridge is electrically coupled to the second semiconductor die via the motherboard.

In Example 16, the subject matter of any one or more of Examples 14-15 optionally include wherein the second semiconductor die is attached to a bottom surface of the substrate, the bottom surface opposite the top surface.

In Example 17, the subject matter of Example 16 optionally includes wherein the second end of the silicon interconnect bridge is attached to the side surface of the substrate and electrically coupled to the second semiconductor die via the multi-layer break out pads.

In Example 18, the subject matter of any one or more of Examples 13-17 optionally include wherein the silicon interconnect bridge is at least partially embedded in the substrate; wherein the second semiconductor die is attached to a bottom surface of the substrate, the bottom surface opposite the top surface; and wherein the second semiconductor die is electrically coupled to the silicon interconnect bridge via the substrate.

In Example 19, the subject matter of Example 18 optionally includes wherein the substrate includes a first set of multi-layer break out pads and a second set of multi-layer break out pads; wherein the first end of the silicon interconnect bridge is electrically coupled to the first semiconductor die via the first set of multi-layer break out pads; and wherein the second end of the silicon interconnect bridge is electrically coupled to the second semiconductor die via the second set of multi-layer break out pads.

In Example 20, the subject matter of any one or more of Examples 13-19 optionally include wherein the second semiconductor die is a memory die.

Example 21 is a computing device, comprising: a mass storage device; a substrate; a first semiconductor die attached to a top surface of the substrate; a silicon interconnect bridge attached to a side surface of the substrate, the side surface substantially orthogonal to the top surface, and wherein a first end of the silicon interconnect bridge is electrically coupled to the first semiconductor die via the substrate; and a second semiconductor die electrically coupled to a second end of the silicon interconnect bridge.

In Example 22, the subject matter of Example 21 optionally includes wherein the substrate includes multi-layer break out pads; and wherein the silicon interconnect bridge is attached to the side surface of the substrate and electrically coupled to the semiconductor die via the multi-layer break out pads.

In Example 23, the subject matter of Example 22 optionally includes a motherboard attached to a bottom surface of the substrate, the bottom surface opposite the top surface; and wherein the second semiconductor die is attached to the motherboard; wherein the motherboard includes a cavity; wherein the second end of the silicon interconnect bridge extends into the cavity of the motherboard; wherein the silicon interconnect bridge is attached to the motherboard within the cavity of the motherboard; and wherein the silicon interconnect bridge is electrically coupled to the second semiconductor die via the motherboard.

In Example 24, the subject matter of any one or more of Examples 22-23 optionally include wherein the second semiconductor die is attached to a bottom surface of the substrate, the bottom surface opposite the top surface.

In Example 25, the subject matter of Example 24 optionally includes wherein the second end of the silicon interconnect bridge is attached to the side surface of the substrate and electrically coupled to the second semiconductor die via the multi-layer break out pads.

In Example 26, the subject matter of any one or more of Examples 21-25 optionally include wherein the silicon interconnect bridge is at least partially embedded in the substrate; wherein the second semiconductor die is attached to a bottom surface of the substrate, the bottom surface opposite the top surface; and wherein the second semiconductor die is electrically coupled to the silicon interconnect bridge via the substrate.

In Example 27, the subject matter of Example 26 optionally includes wherein the substrate includes a first set of multi-layer break out pads and a second set of multi-layer break out pads; wherein the first end of the silicon interconnect bridge is electrically coupled to the first semiconductor die via the first set of multi-layer break out pads; and wherein the second end of the silicon interconnect bridge is electrically coupled to the second semiconductor die via the second set of multi-layer break out pads.

In Example 28, the subject matter of any one or more of Examples 21-27 optionally include wherein the computing device is a cellular telephone.

Example 29 is a method comprising: attaching a first semiconductor die to a top surface of a substrate; attaching a first end of an interconnect bridge to a side surface of the substrate, wherein the first end of the interconnect bridge is electrically coupled to the first semiconductor; and coupling, electrically, a second semiconductor die to a second end of the interconnect bridge.

In Example 30, the subject matter of Example 29 optionally includes wherein attaching the first end of the interconnect bridge to the side surface of the substrate includes using a set of multi-layer break out pads of the substrate.

In Example 31, the subject matter of Example 30 optionally includes attaching a bottom surface of the substrate to a motherboard, wherein the motherboard includes a cavity; wherein the second end of the interconnect bridge extends into the cavity; and wherein coupling the second semiconductor die to the second end of the interconnect bridge includes attaching the second end of the interconnect bridge to the motherboard with the cavity.

In Example 32, the subject matter of any one or more of Examples 29-31 optionally include wherein the substrate includes multi-layer break out pads; wherein the second semiconductor die is attached to the bottom surface of the substrate; wherein the first end of the interconnect bridge is electrically coupled to the first semiconductor die via the multi-layer break out pads; and wherein the second end of the interconnect bridge is electrically coupled to the second semiconductor die via the multi-layer break out pads.

In Example 33, the subject matter of any one or more of Examples 29-32 optionally include where attaching the interconnect bridge to a second side of the substrate includes at least partially embedding the interconnect bridge in the substrate.

These and other examples and features of the present interconnect bridge attached to a side surface, interconnect bridge side surface systems, and related methods will be set forth in part in the following detailed description. This overview is intended to provide non-limiting examples of the present subject matter—it is not intended to provide an exclusive or exhaustive explanation. The detailed description below is included to provide further information about the present interconnects, interconnect systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A semiconductor device, comprising:
   a substrate;
   a motherboard attached to the substrate;
   a first semiconductor die attached to the substrate, wherein the substrate includes multi-layer break out pads;
   a silicon interconnect bridge attached to a side surface of the substrate and wherein the silicon interconnect bridge is electrically coupled to the first semiconductor die via the multi-layer break out pads;
   a second semiconductor die electrically coupled to a second end of the silicon interconnect bridge, wherein the second semiconductor die is attached to the motherboard and wherein the motherboard includes a cavity;
   wherein the second end of the interconnect bridge extends into the cavity of the motherboard;
   wherein the silicon interconnect bridge is attached to the motherboard within the cavity of the motherboard; and
   wherein the silicon interconnect bridge is electrically coupled to the second semiconductor die via the motherboard.

2. The semiconductor device of claim 1, wherein the second semiconductor die is a memory die.

3. The semiconductor device of claim 1, wherein the first semiconductor die is a central processing unit.

4. The semiconductor device of claim 1, wherein the interconnect bridge is attached to the substrate orthogonal to the first semiconductor die.

5. A computing device, comprising:
   a mass storage device;
   a substrate;
   a motherboard attached to the substrate;
   a first semiconductor die attached to a top surface of the substrate, wherein the substrate includes multi-layer break out pads;
   a silicon interconnect bridge attached to a side surface of the substrate, the side surface orthogonal to the top surface, and wherein a first end of the silicon interconnect bridge is electrically coupled to the first semiconductor die via the multi-layer break out pads; and
   a second semiconductor die electrically coupled to a second end of the silicon interconnect bridge, wherein the second semiconductor die is attached to the motherboard and wherein the motherboard includes a cavity;
   wherein the second end of the interconnect bridge extends into the cavity of the motherboard;
   wherein the silicon interconnect bridge is attached to the motherboard within the cavity of the motherboard; and
   wherein the silicon interconnect bridge is electrically coupled to the second semiconductor die via the motherboard.

6. The semiconductor device of claim 5, wherein the computing device is a cellular telephone.

7. A method comprising:
   attaching a first semiconductor die to a top surface of a substrate;
   attaching a first end of a silicon interconnect, bridge to a side surface of the substrate using a set of multi-layer break out pads of the substrate, wherein the first end of the silicon interconnect bridge is electrically coupled to the first semiconductor die; and
   coupling, electrically, a second semiconductor die to a second end of the interconnect bridge;
   attaching a bottom surface of the substrate to a motherboard, wherein the motherboard includes a cavity;
   wherein the second end of the interconnect bridge extends into the cavity; and
   wherein coupling the second semiconductor die to the second end of the interconnect bridge includes attaching the second end of the interconnect bridge to the motherboard with the cavity.

* * * * *